United States Patent [19]

Yang et al.

[11] Patent Number: 5,468,980
[45] Date of Patent: Nov. 21, 1995

[54] BURIED BIT LINE DRAM CELL

[75] Inventors: Ming-Tzong Yang; Chen-Chiu Hsue; Gary Hong, all of Hsin, Taiwan

[73] Assignee: United Microelectronics Corporation, Hsinchu, Taiwan

[21] Appl. No.: 334,046

[22] Filed: Nov. 4, 1994

Related U.S. Application Data

[62] Division of Ser. No. 192,364, Feb. 7, 1994, Pat. No. 5,364,808.

[51] Int. Cl.$^6$ .......................... H01L 27/108; H01L 29/76
[52] U.S. Cl. .......................... 257/306; 257/389
[58] Field of Search .................. 257/306, 307, 257/308, 309, 389, 296

[56] References Cited

U.S. PATENT DOCUMENTS

| | | | |
|---|---|---|---|
| 4,493,057 | 1/1985 | McElroy | 257/316 |
| 4,891,747 | 1/1990 | Baglee | 257/296 |
| 4,958,318 | 9/1990 | Harari | 365/149 |
| 4,959,698 | 9/1990 | Shinichi | 257/296 |
| 4,970,564 | 11/1990 | Kimura et al. | 257/306 |
| 5,170,234 | 12/1992 | Baglee et al. | 257/389 |
| 5,188,975 | 2/1993 | Kojima et al. | 437/48 |

*Primary Examiner*—Robert P. Limanek
*Attorney, Agent, or Firm*—George O. Saile; Graham S. Jones, II

[57] ABSTRACT

Ions of dopant are implanted into predetermined locations in a doped semiconductor substrate in sufficient concentration to form a buried conductor regions. A thick dielectriv layer overlies the surface of the doped substrate. A first polysilicon layer is formed and patterned on the silicon dioxide layer by a mask and etching to form conductor lines, covered by a dielectric. A second polysilicon layer is formed on the second dielectric layer and patterned to form a first capacitor plate. A third dielectric layer is formed on the surface of the second polysilicon layer. A third polysilicon layer is formed on the third dielectric layer and patterned to form a top capacitor plate. A layer of BPSG is deposited upon the third layer of polysilicon.

26 Claims, 9 Drawing Sheets

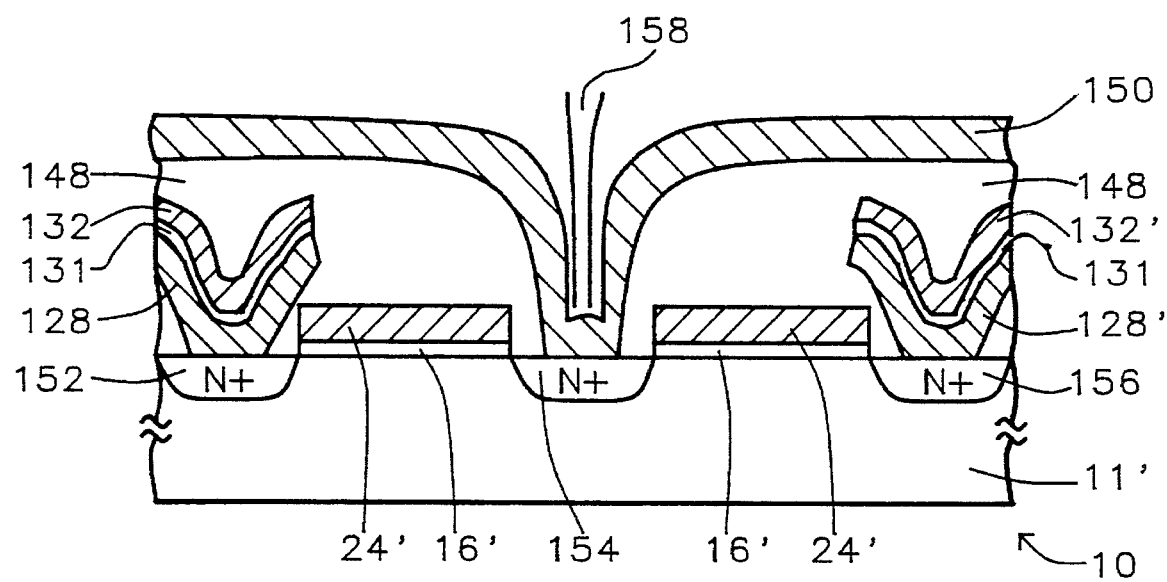
FIG. 7 - Prior Art

BURIED BIT LINE DRAM CELL

This is a Division of application Ser. No. 08/192,364 Feb. 7, 1994 which is now U.S. Pat. No. 5,364,808.

BACKGROUND OF THE INVENTION

1. Field of the Invention

This invention relates to thin film semiconductor DRAM memories and more particularly to buried bit line DRAM memories.

2. Description of Related Art

Conventional manufacturing process provide DRAMs with poor bit line step coverage. Moreover, bit line contact is difficult to process because of poor step coverage or because of processing requirements such as required for using the buried N+ bit lines as described in (UMC2-93-010) M. T. Yang and G. Hong Ser. No. 08/100,707 filed Aug. 2, 1993 for an "MOSFET Device with Buried Bit Line", wherein a high energy implant or epitaxial process is required. For example, some ROMs use a buried bit line.

See U.S. Pat. No. 5,188,975 of Kojima et al for "method of Producing a Connection Hole for a DRAM Having at Least Three Conductor Layers in a Self Alignment Manner" which describes a stacked capacitor layout and process.

SUMMARY OF THE INVENTION

An object of this invention is to provide good bit line step coverage in a semiconductor memory cell.

Another object of this invention is to provide a memory cell design providing ease of production.

Still another object of this invention is to provide a memory cell having a small cell size.

In accordance with this invention, a device and a method of manufacture of that semiconductor device, involve the following steps:

a) implanting ions of dopant into predetermined locations in a doped semiconductor substrate of the device, the dopant being of sufficient concentration to form a buried conductor region therein, b) forming a dielectric layer on the surface of the doped substrate forming a thick dielectric over the implanted ions, c) formation of a first polysilicon layer on the silicon dioxide layer, d) patterning the first polysilicon layer by forming a mask with openings and etching the polysilicon through the openings in the mask to form conductor lines, e) forming a second dielectric layer on the surface of the first polysilicon layer on the device, f) forming a second polysilicon layer on the second dielectric layer, g) forming a photolithographic mask and etching portions of the second polysilicon layer to form a first capacitor plate therefrom, h) forming a third dielectric layer on the surface of the second polysilicon layer on the device, i) formation of a third polysilicon layer on the third dielectric layer, and j) patterning the third polysilicon layer by forming a mask and etching the polysilicon through the mask to form a top capacitor plate. Preferably, the second and third dielectric layers comprises ONO, the second polysilicon layer is in electrical contact with the doped region in the substrate, the layer of BPSG is deposited upon the third layer of polysilicon.

Alternatively in accordance with this invention, the device and its manufacture involve the following steps:

a) implanting ions into a predetermined location in a doped substrate in a semiconductor substrate of the device to form at least one conductive region therein, the dopant being of sufficient concentration to form a buried conductor region therein, b) forming a silicon dioxide layer on the surface of the doped substrate forming thicker oxide over the implanted ions, c) formation of a first polysilicon layer on the silicon dioxide layer, d) patterning the first polysilicon layer by forming a mask with openings and etching the polysilicon through the openings in the mask, e) forming a first inter polysilicon layer on the surface of the first polysilicon layer on the device, f) forming a mask on the first inter polysilicon layer and etching of the exposed portions of the inter polysilicon layer exposing the surface of the doped substrate, g) forming a second polysilicon layer on the inter polysilicon layer, h) forming a photolithographic mask on second polysilicon layer with openings therein, i) patterning the second polysilicon layer by etching the second polysilicon layer through the openings in the mask to form a first capacitor plate therefrom, j) forming a second inter polysilicon layer on the surface of the second polysilicon layer on the device, k) formation of a third polysilicon layer on the second inter polysilicon layer, l) forming a photolithographic mask on third polysilicon layer with openings therein, m) patterning the third polysilicon layer by etching the third polysilicon layer through the mask to form a top capacitor plate, n) forming a second silicon dioxide layer on the exposed surface of the doped substrate, and o) depositing a layer of BPSG upon the third layer of polysilicon, whereby preliminary manufacture of the device is completed.

Preferably, the first and second inter polysilicon layer comprise ONO; the second polysilicon layer is in electrical contact with the doped region in the substrate, and the dose of the ion implantation should be with the range from about $5 \times 10^{13}/cm^2$ to about $1 \times 10^{16}/cm^2$ at a level from about 20 keV to about 150 keV.

BRIEF DESCRIPTION OF THE DRAWINGS

The foregoing and other aspects and advantages of this invention are explained and described below with reference to the accompanying drawings, in which:

FIG. 5 shows a section of the device of FIG. 1 taken along line 5—5 in. FIG. 1.

FIG. 6 shows a section of the device of FIG. 1 taken along line 6—6 in. FIG. 1.

FIG. 7 shows a conventional prior art cell in which the bit line is metal or polysilicon, so there is poor step coverage.

DESCRIPTION OF THE PREFERRED EMBODIMENT

An advantage of the process of this invention is that there is good bit line step coverage (diffusion, i.e. a buried N+ bit line is formed in a silicon substrate with N+ doping before polysilicon deposition.)

Moreover, there is no contact to a buried bit line in a single cell. Instead, in accordance with this invention, contact is made to buried bit lines at one of say 32 cells. This is a key advantage since there is no contact to buried bit lines in each cell or every other cell as in metal or polysilicon bit line DRAMs there is more room for a larger capacitor and/or a smaller cell.

Figure 1:
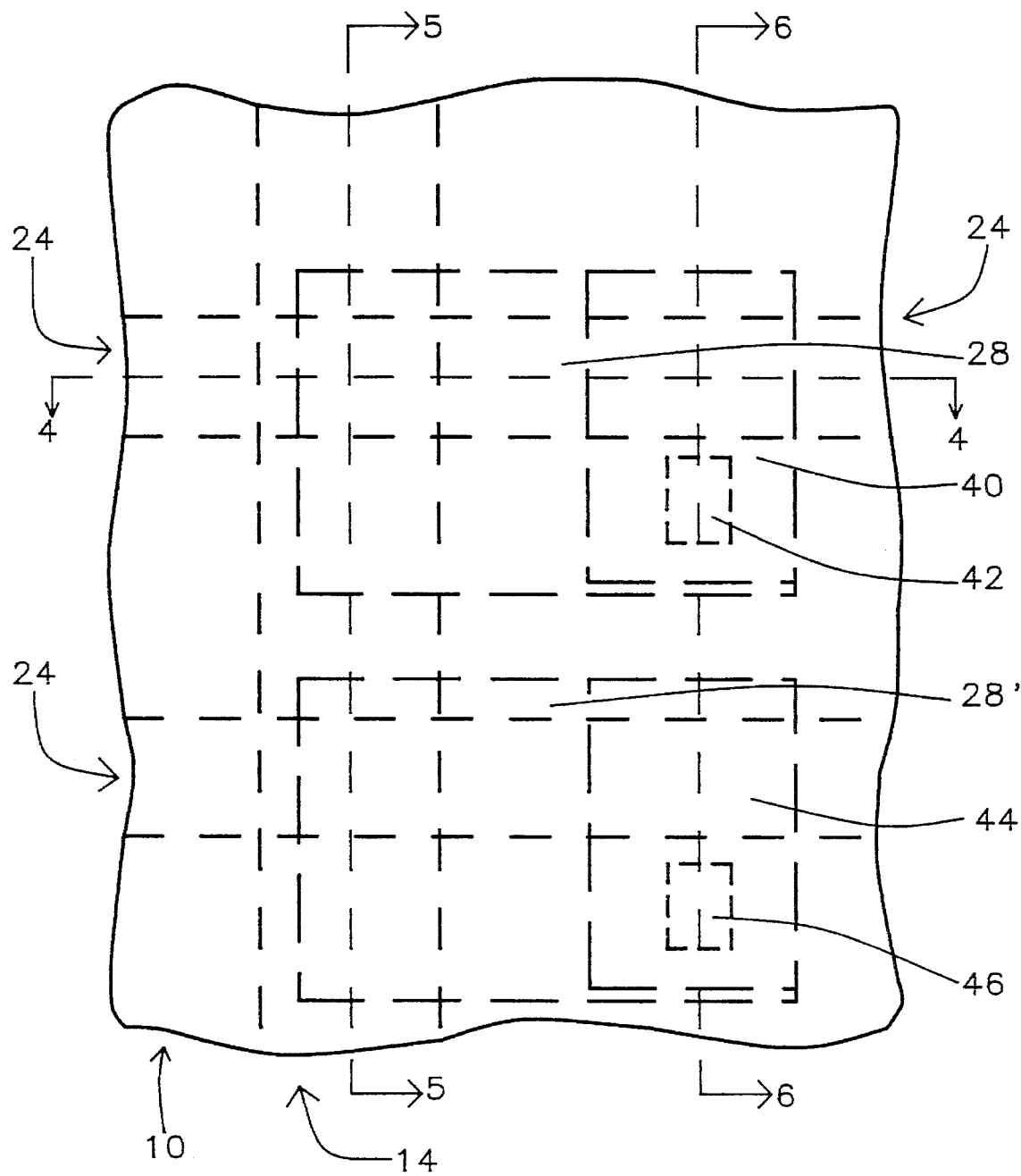
FIG. 1 shows a plan view of a silicon device 10 made in accordance with this invention.

FIG. 1 shows a plan view of a silicon device 10 made in accordance with this invention. A pair of buried N+ bit lines 14 well below the surface of device 10 are shown in phantom as being vertically oriented. Extending orthogonally to bit lines 14, also below the surface of device 10, are polysilicon 1 (or polycide) word lines 24. (Polysilicon 1 is often referred to in the art as "poly 1".)

Process of Manufacture

The process employed in accordance with this invention for producing the device of this invention is illustrated by cross-sectional views taken along line 4—4 in FIG. 1 of several of a sequence of processing steps as shown in FIGS. 2A-2B, FIG. 3, and FIGS. 4A-4E.

Figure 2A:
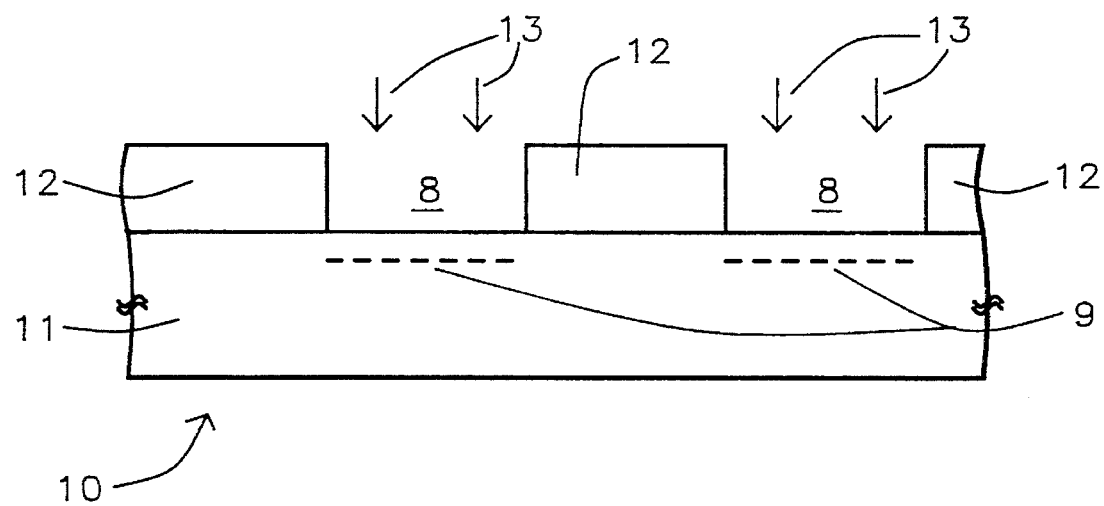
FIGS. 2A–2B, FIG. 3, and FIGS. 4A–4E show cross-sectional views taken along line 4—4 in FIG. 1 illustrating a sequence of processing steps in accordance with this invention.

FIG. 2A shows doped silicon substrate 11 of device 10, with P- type substrate doping from about 1 E 15 cm$^{-3}$ to about 5 E 17 cm$^{-3}$. The substrate 11 is covered with a photoresist mask 12 which is patterned in accordance with conventional photolithographic techniques well known to those skilled in the art to form openings 8 in mask 12.

An N+ implant of ions 13 is performed, preferably employing ions of arsenic (As) dopant 9 through the openings 8 in mask 12 into the substrate 11 as shown in FIG. 2A. The dose of the arsenic ions implanted should be with the range from about $5\times10^{13}$/cm$^2$ to about $1\times10^{16}$/cm$^2$ at a level from about 20 keV to about 150 keV.

Next, the mask 12 is stripped.

Figure 2B:
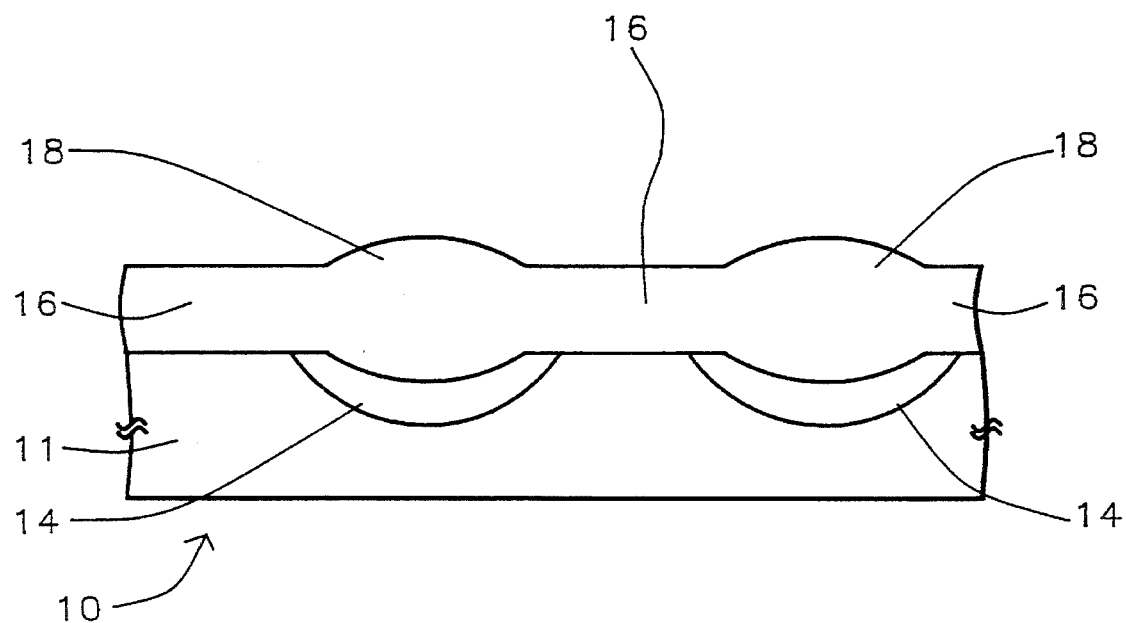

FIG. 2B shows a gate oxide layer 16 formed on the product of FIG. 2A, having a thickness of from about 50 Å to about 250 Å employing a conventional process. However, thicker oxide structures 18 are formed above dopant 9 instead of the thin gate oxide layer 16 where the buried N+ arsenic dopant 9 enhances formation of oxide on the substrate 11, as shown in FIG. 2B. The thicker oxide structures 18 have a thickness of from about 100 Å to about 1500 Å, within a range between about 2 times and six times the thickness of gate oxide layer 16.

Buried N+ conductor structures 14, 40 and 44 are formed beneath the thicker oxide structure 18, during the formation of the gate oxide, as will be well understood by those skilled in the art. (Note that the structures 14 are the buried bit lines 13.)

The thicker oxide structures 18 are formed where the buried N+ arsenic dopant 9 is in the substrate 11 having a thickness of from about 100 Å and about 1500 Å.

Figure 3:
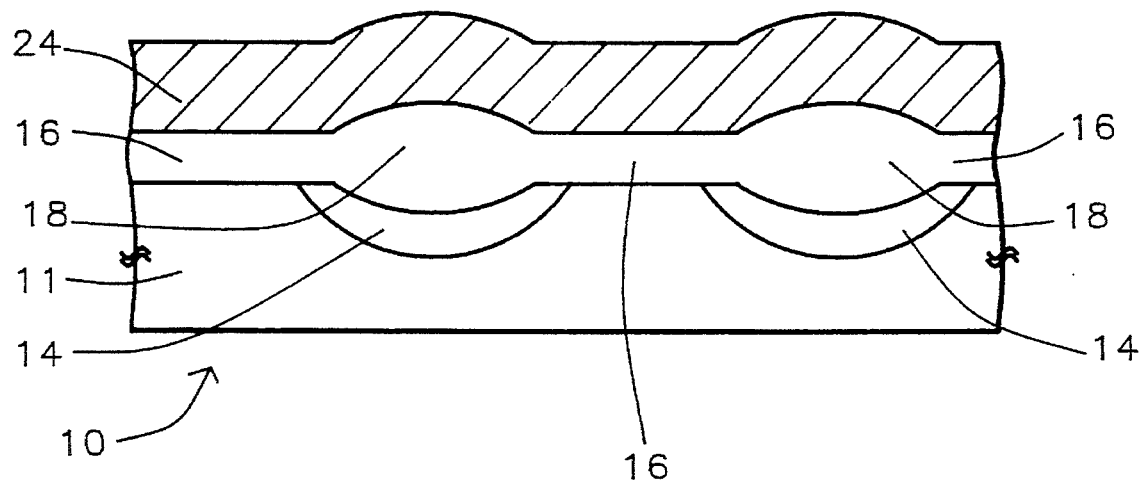

Referring to FIG. 3, the polysilicon 1 layer 24 is deposited on the product of FIG. 2B on the oxide layer 16 and structures 18 formed. The polysilicon 1 layer 24 is doped in the conventional manner.

Again referring to FIG. 3 and FIG. 1, by means of a photolithographic masking followed by etching the polysilicon 1 layer 24 is formed into word lines 24 located as shown in phantom in FIG. 1, the layer 24 is formed into structures 24 which are word lines 24 located as shown in phantom in FIG. 1.

Figure 4A:
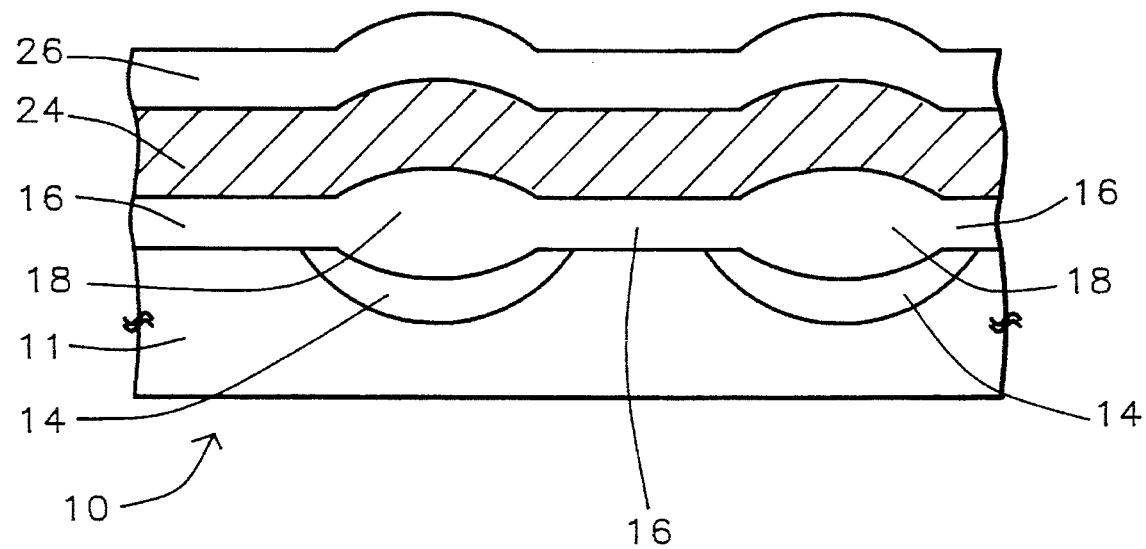
Figure 4B:
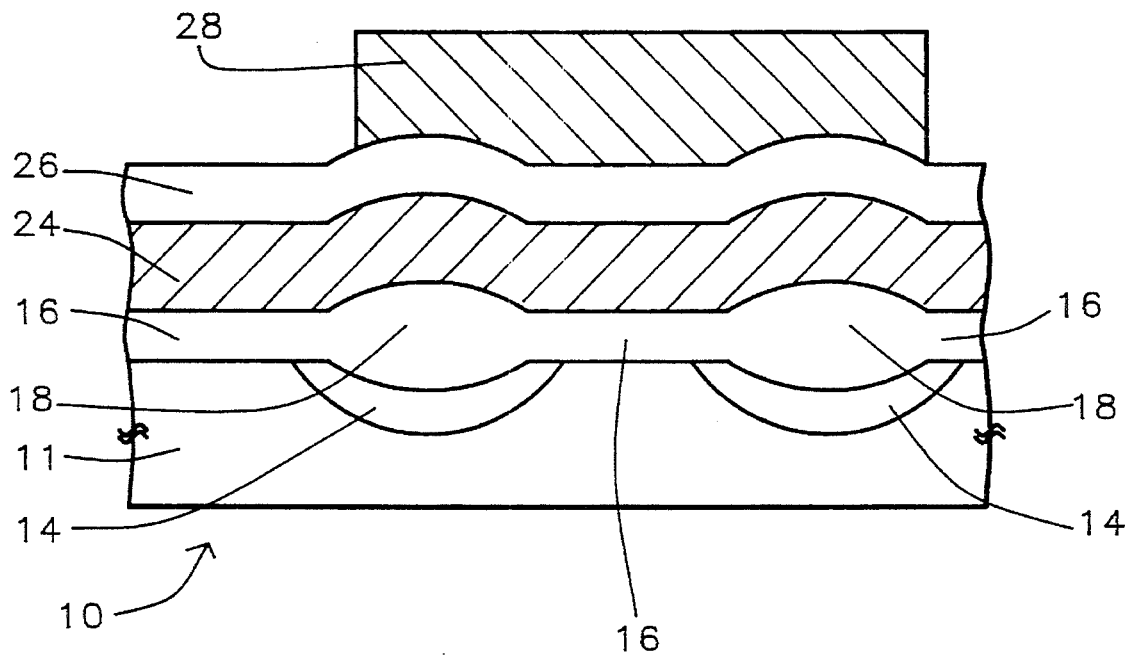

Referring to FIG. 4A, a first layer of inter polysilicon dielectric 26 has been formed on the top of polysilicon 1 structure 24. The inter polysilicon dielectric can be thermal oxide or ONO (oxide-nitride-oxide.) The ONO can be formed by a thin thermal oxide having a thickness of about 80 Å followed by LPCVD of silicon nitride having a thickness of about 100 Å and final thermal oxidation or CVD oxide having a thickness of from about 20 Å to about 50 Å.

Preferably the dielectric 26 is formed by depositing an oxide by means of CVD (Chemical Vapor Deposition.) The inter polysilicon dielectric can be thermal oxide or ONO (oxide-nitride- oxide.) The ONO can be formed by a thin thermal oxide having a thickness of from about 30 Å to about 80 Å followed by LPCVD of silicon nitride having a thickness of from about 60 Å to about 150 Å and final thermal oxidation or CVD oxide having a thickness between about 20 Å and about 50 Å.

Next a mask is formed on the first inter polysilicon layer to form openings for contact to the N+ doped regions 40 and 44 in substrate 11. Etching is performed through a mask to remove of the exposed portions of said inter polysilicon layer exposing the surface of the N+ doped substrate regions 40 and 44.

The polysilicon 2 layer 28 is deposited on the oxide layer 26 of the product of FIG. 4A. The polysilicon 2 layer 28 is doped in the conventional manner.

Again referring to FIG. 4B and FIG. 1, by means of a photolithographic masking followed by etching the polysilicon 2 layer 24 is formed as shown in FIG. 4B forming capacitor plates 28 and 28'. Plate 28 comprises the lower plates of capacitors, and spanning the structures 18 and the buried bit lines 14 as seen along section line 4—4 in FIG. 1.

Figure 4C:
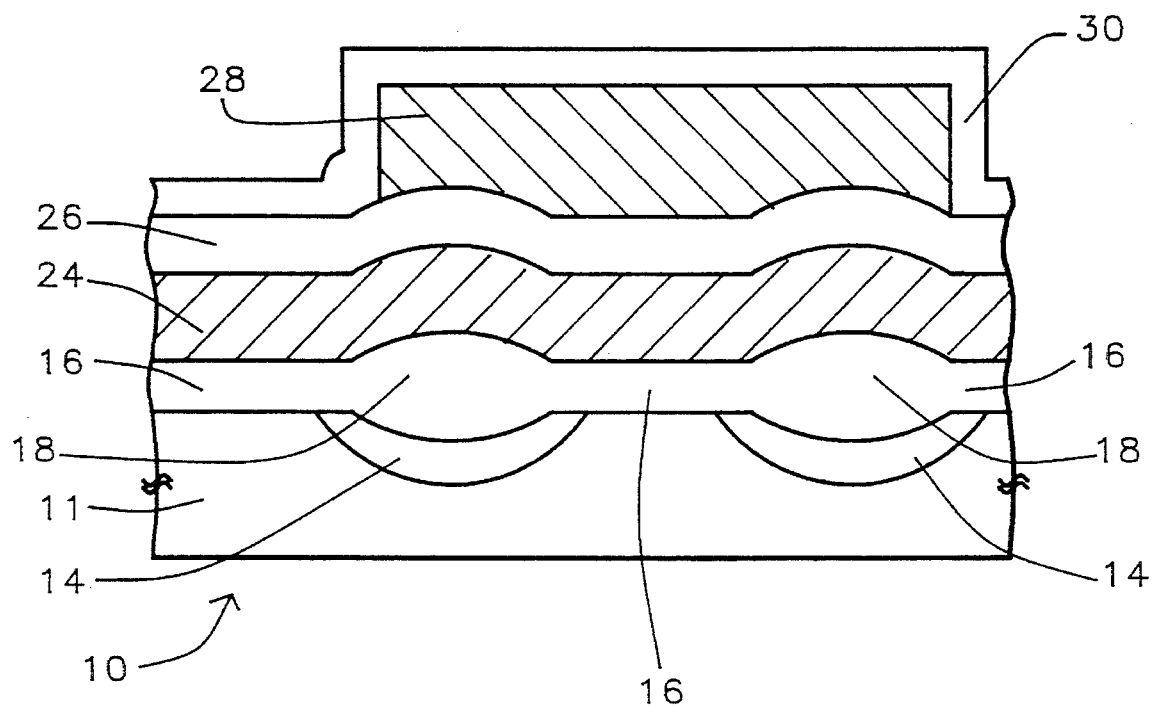

Referring to FIG. 4C, a second layer of inter polysilicon dielectric 30 has been formed on the top of polysilicon 2 plates 28 and 28'. Dielectric layer 30 serves as the capacitor dielectric, but it is deposited upon the entire surface of the device 10, so it is deposited upon the exposed surfaces of oxide layer 26.

Figure 4D:
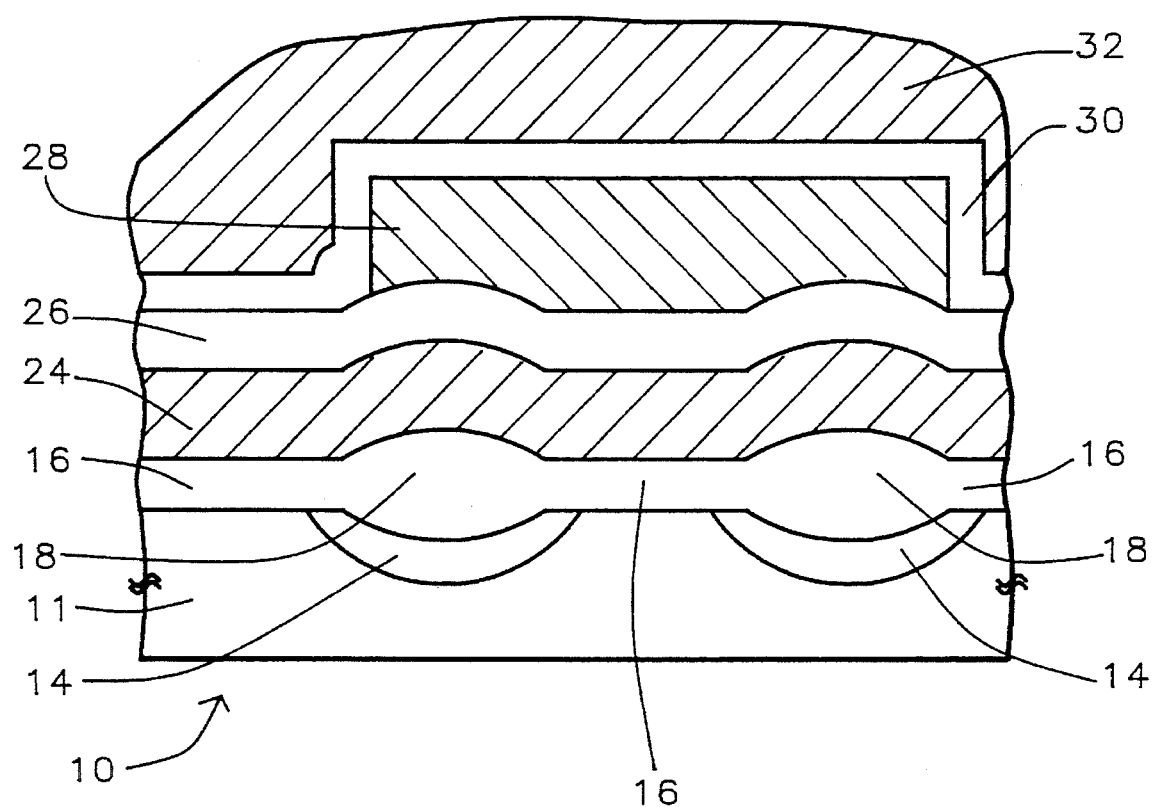

Referring to FIG. 4D, polysilicon 3 layer 32 is deposited on the product of FIG. 4C, on the oxide layer 30 for the purpose of providing an upper plate 32 for the capacitor.

Again referring to FIG. 4D by means of a photolithographic mask and etching the polysilicon 3 layer 32 is shaped into a large plate for Vss and it can be picked up by meal and contact for a long distance of from about 20 micrometers to about 500 micrometers.

Figure 4E:
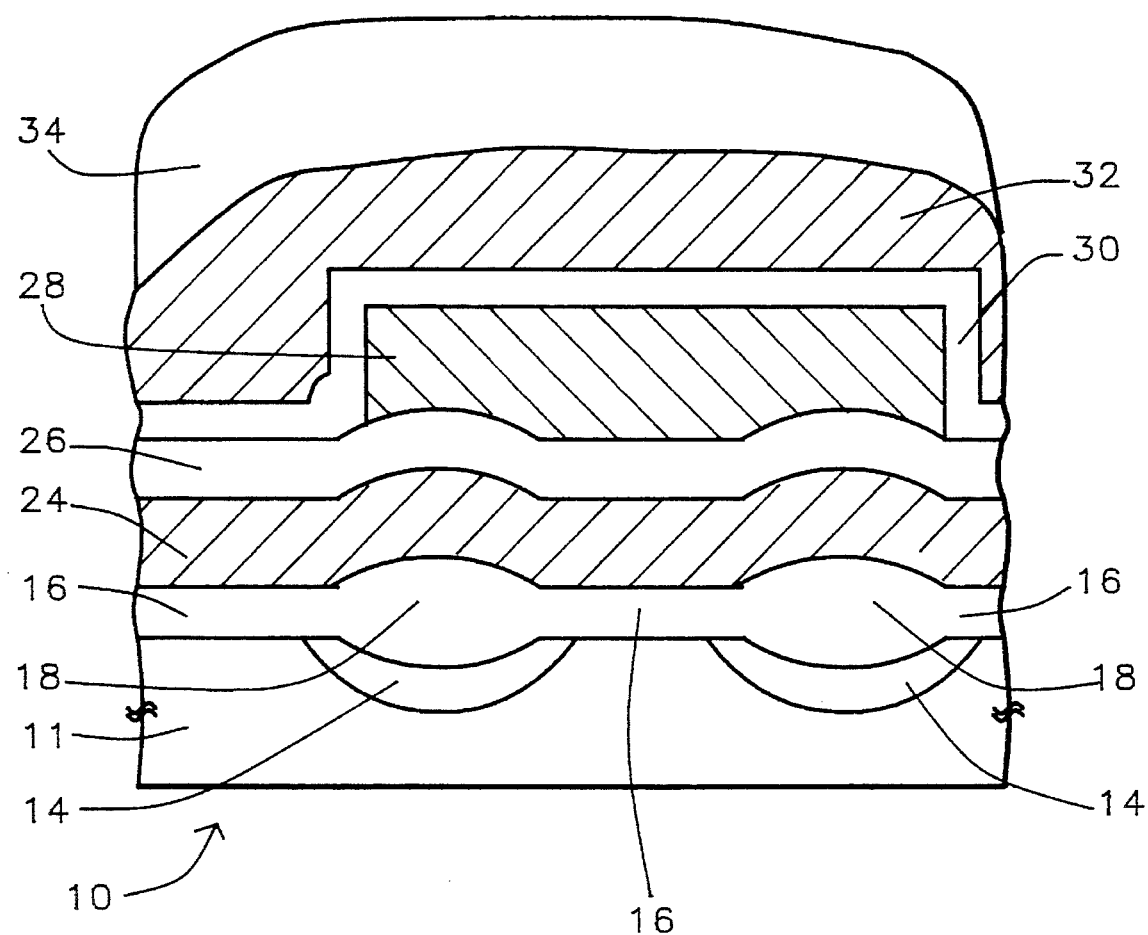

In FIG. 4E a glass layer 34, preferably PSG or BPSG. For example BPSG can be formed with a thickness of from about 2,000 Å to about 10,000 Å with boron (B) from about 2% to about 6.0% and with phosphorous (P) from about 2% to about 6.0%. The process used to deposit the BPSG layer preferably comprises APCVD, PECVD, or LPCVD. PSG is also deposited by APCVD, PECVD, or LPCVD.

There are no contacts and metal on the DRAM cell. We can pick up the bitlines with one connection per 8 bits to 64 bits.

The conventional backend process steps follow.

Figure 5:
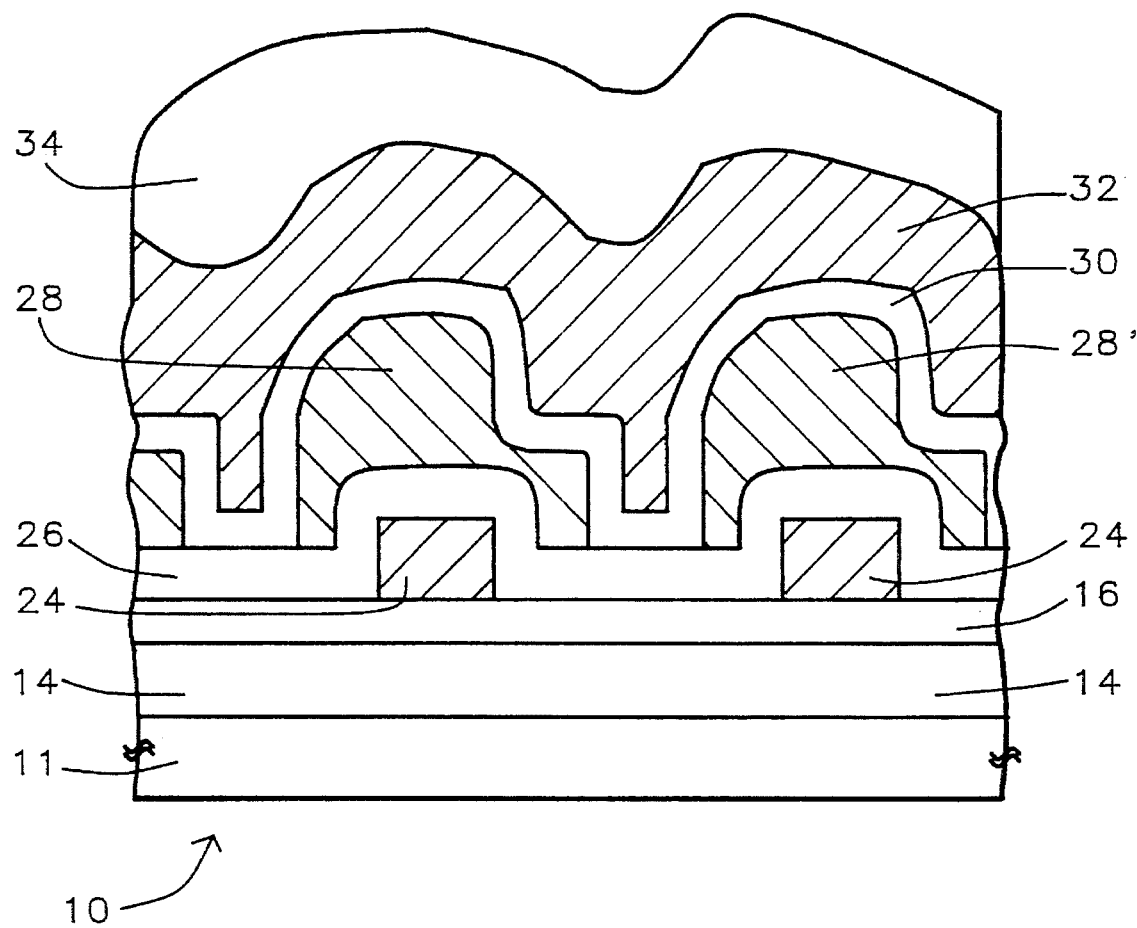

FIG. 5 shows a section of the device of FIG. 1 taken along line 5—5 in. FIG. 1. The semiconductor substrate 11 is shown with the bit line 14 extending from left to right beneath the gate oxide layer 16. The word lines 24 are seen above the gate oxide layer 16 covered by first layer of inter polysilicon dielectric 26. Above each of the word lines 24 a lower capacitor plate 28 is shown. Above lower plate 28 is dielectric layer 30 which in turn is covered by polysilicon 3 layer 32 which is covered by BPSG glass layer 34. There are two separated sections of the lower plate of the capacitor 28. This is a two cell cross section so there are two lower plates of the capacitors 28 and 28'.

Figure 6:
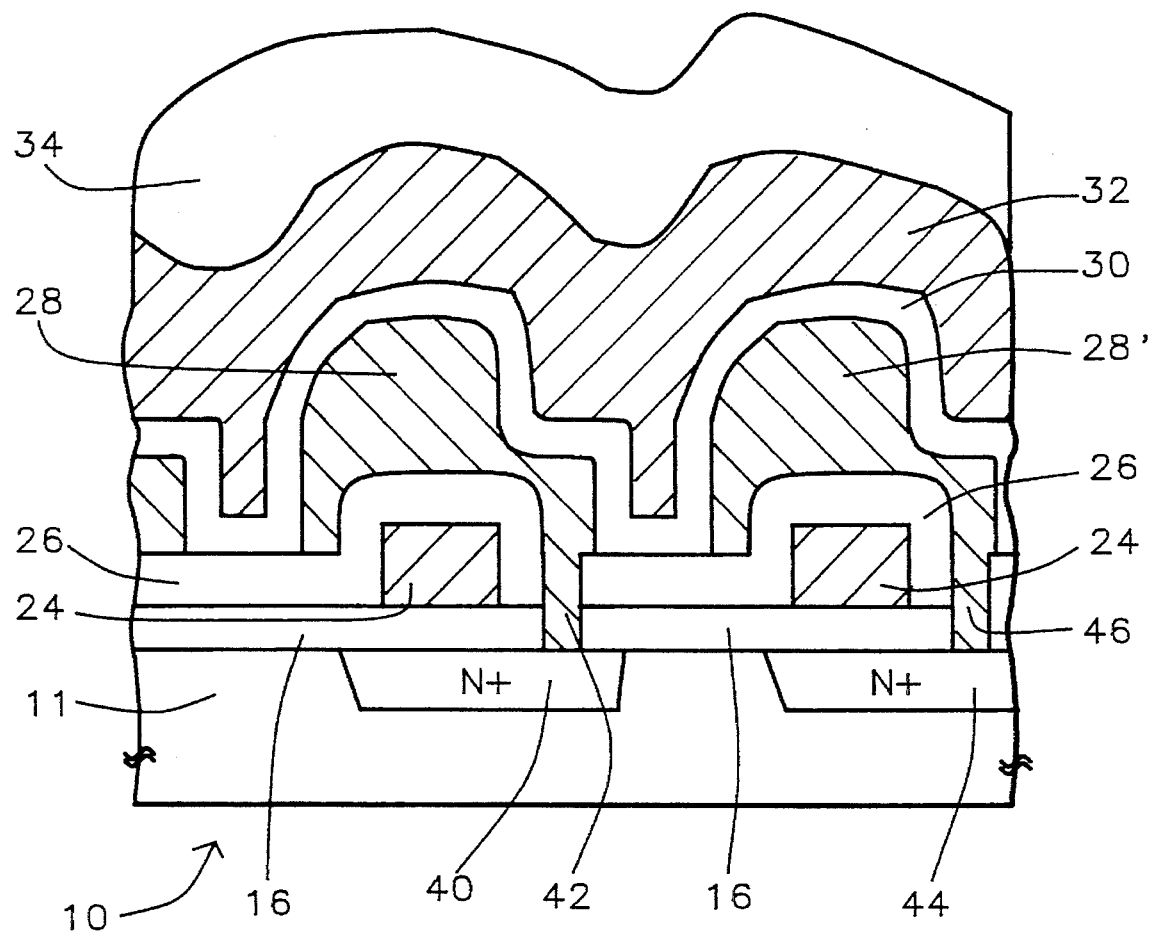

FIG. 6 shows a section of the device of FIG. 1 taken along line 6—6 in. FIG. 1. The cross section is very similar to FIG. 5 except that there are contacts 42 and 46 which extend down through the gate oxide layer 16 into electrical and mechanical contact with the N+ elements 40 and 42 in the substrate 11. The plates 28 and 28' are separated and connected to separate buried conductors 40 and 44. Plates 28 and 28' are the lower plates of the capacitors of two different cells.

FIG. 7 shows a conventional cell 10' in which the bit line is metal or polysilicon 4 layer 150 on top of the structure, so there is poor step coverage. Cell 10' includes a P-sub 11' upon which gate oxide layer 16' is formed, carrying polysilicon 1 gates 24'. The P-sub 11' also includes N+ doped regions 152, 154 and 156. Upon N+ doped regions 128 and 128', polysilicon 2 structures 128 and 128' respectively are formed, extending through the gate oxide layer 16'. A interpolysilicon dielectric layer 131 is formed upon structures 128 and 128' followed by polysilicon 3 structures 132 and 132' respectively resting upon structures 128 and 128'. Next a dielectric layers 148 and 148' are formed and then upon the layers 148 and 148' a polysilicon 4 bit line 150 is formed connecting down to the doped region 154 through the dielectric layer 148. At points 158, the poor bit line step coverage 158 is shown. However, as contrasted with the prior art device of FIG. 7, now referring to FIGS. 1–6 which illustrate devices in accordance with this invention, the bit lines 14 are buried by means of an N+ diffusion, so there is no step coverage problem.

Elements 40 AND 44 are located in buried bit line 14. Elements 40 and 44 are separated for the two different nodes of the two different cells.

Buried bit line 14 in FIG. 1 is continuous as where elements 40 and 44 are located. The elements 40 AND 44 are separated by the steps described above in connection with FIG. 2B forming buried N+ conductor structures 14, 40 and 44 formed beneath the thicker oxide structure 18, during the formation of the gate oxide, as will be well understood by those skilled in the art.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor device manufactured by the process comprising the following steps:

a) implanting ions of dopant into predetermined locations in a doped semiconductor substrate of said device, said dopant being of sufficient concentration to form a buried conductor region therein, b) forming a dielectric layer on the surface of said doped substrate forming a thick dielectric over said implanted ions, c) formation of a first polysilicon layer on said silicon dioxide layer, d) patterning said first polysilicon layer by forming a mask with openings and etching said polysilicon through said openings in said mask to form conductor lines, e) forming a second dielectric layer on the surface of said first polysilicon layer on said device, f) forming a second polysilicon layer on said second dielectric layer, g) forming a photolithographic mask and etching portions of said second polysilicon layer to form a first capacitor plate therefrom, h) forming a third dielectric layer on the surface of said second polysilicon layer on said device, i) formation of a third polysilicon layer on said third dielectric layer, and j) patterning said third polysilicon layer by forming a mask and etching said polysilicon through said mask to form a top capacitor plate.

2. A device in accordance with claim 1 wherein said second dielectric layer comprises ONO.

3. A device in accordance with claim 2 wherein said third dielectric layer comprises ONO.

4. A device in accordance with claim 3 wherein said second polysilicon layer is in electrical contact with said doped region in said substrate.

5. A device in accordance with claim 4 wherein a layer of BPSG is deposited upon said third layer of polysilicon.

6. A semiconductor device manufactured by the process comprising the following steps:

a) implanting ions into a predetermined location in a doped substrate in a semiconductor substrate of said device to form at least one conductive region therein, said dopant being of sufficient concentration to form a buried conductor region therein, b) forming a silicon dioxide layer on the surface of said doped substrate forming thicker oxide over said implanted ions, c) formation of a first polysilicon layer on said silicon dioxide layer, d) patterning said first polysilicon layer by forming a mask with openings and etching said polysilicon through said openings in said mask, e) forming a first inter polysilicon layer on the surface of said first polysilicon layer on said device, f) forming a mask on said first inter polysilicon layer and etching of the exposed portions of said inter polysilicon layer exposing the surface of said doped substrate, g) forming a second polysilicon layer on said inter polysilicon layer, h) forming a photolithographic mask on second polysilicon layer with openings therein, i) patterning said second polysilicon layer by etching said second polysilicon layer through said openings in said mask to form a first capacitor plate therefrom, j) forming a second inter polysilicon layer on the surface of said second polysilicon layer on said device, k) formation of a third polysilicon layer on said second inter polysilicon layer, l) forming a photolithographic mask on third polysilicon layer with openings therein, m) patterning said third polysilicon layer by etching said third polysilicon layer through said mask to form a top capacitor plate, n) forming a second silicon dioxide layer on the exposed surface of said doped substrate, and o) depositing a layer of BPSG upon said third layer of polysilicon, whereby preliminary manufacture of said device is completed.

7. A device in accordance with claim 6 wherein said first inter polysilicon layer comprises ONO.

8. A device in accordance with claim 7 wherein said second inter polysilicon layer comprises ONO.

9. A device in accordance with claim 8 wherein said second polysilicon layer is in electrical contact with said doped region in said substrate.

10. A device in accordance with claim 6 wherein the dose of said ion implantation should be with the range from about $5\times10^{13}/cm^2$ to about $1\times10^{16}/cm^2$ at a level from about 20 keV to about 180 keV.

11. A semiconductor device comprising:

a) a doped semiconductor substrate with a buried, doped conductor region formed therein, said doped conductor region formed of dopant ions implanted into said semiconductor substrate, b) a thick dielectric layer on the surface of said doped substrate formed over said implanted ions, c) a first polysilicon layer on said dielectric layer layer, d) said first polysilicon layer patterned in the form of conductor lines, e) a second dielectric layer formed on the surface of said first polysilicon layer on said device, f) a second polysilicon layer formed on said second dielectric layer, g) said second polysilicon layer being in the form of a first capacitor plate, h) a third dielectric layer on the surface of said second polysilicon layer on said device, i) a third polysilicon layer on said third dielectric layer, and j) said third polysilicon layer being patterned in the form of a top capacitor plate.

12. A device in accordance with claim 11 wherein said second dielectric layer comprises ONO.

13. A device in accordance with claim 12 wherein said third dielectric layer comprises ONO.

14. A device in accordance with claim 13 wherein said second polysilicon layer is in electrical contact with said doped conductor region in said substrate.

15. A device in accordance with claim 14 wherein a layer of BPSG is deposited upon said third layer of polysilicon.

16. A device in accordance with claim 15 wherein said second polysilicon layer is in electrical contact with said doped region in said substrate.

17. A device in accordance with claim 15 wherein said ion implanted dose is within the range from about $1\times10^{13}/cm^2$ to about $1\times10^{16}/cm^2$ at a level from about 20 keV to about 180 keV.

18. A semiconductor device comprising the following: dopant ions ion implanted into predetermined locations in a doped semiconductor substrate of said device, said dopant being of sufficient concentration to form a buried conductor region therein, a dielectric layer on the surface of said doped substrate forming a thick dielectric over said implanted ions, conductor lines formed from a first polysilicon layer formed on said dielectric layer, a second dielectric layer on the surface of said conductor lines, a first capacitor plate forming a second polysilicon layer on said second dielectric layer, a third dielectric layer on the surface of said first capacitor plate, and a top capacitor plate formed from a third polysilicon layer on said third dielectric layer.

19. A device in accordance with claim 18 wherein said second dielectric layer comprises ONO.

20. A device in accordance with claim 19 wherein said third dielectric layer comprises ONO.

21. A device in accordance with claim 20 wherein said second polysilicon layer is in electrical contact with said doped region in said substrate.

22. A device in accordance with claim 21 wherein a layer of BPSG is deposited upon said third layer of polysilicon.

23. A semiconductor device comprising:

a substrate with a buried conductor region formed therein by implanted ions of sufficient concentration to form a buried conductor region therein, a silicon dioxide layer on the surface of said doped substrate forming a thick oxide over said implanted ions, a first polysilicon layer formed on said silicon dioxide layer patterned with openings therethrough, a first interpolysilicon layer on the surface of said first polysilicon layer on said device with openings therethrough extending down to expose the surface of said doped substrate, a first capacitor plate formed from a second polysilicon layer on said first interpolysilicon layer, a second interpolysilicon layer formed on the surface of said first capacitor plate, a top capacitor plate formed on said second interpolysilicon layer, said top capacitor plate being composed of a third polysilicon layer patterned into said plate, and a BPSG layer formed on said top capacitor plate.

24. A device in accordance with claim 23 wherein said second polysilicon layer is in electrical contact with said doped region in said substrate.

25. A device in accordance with claim 24 wherein the dose of said ion implantation is within the range from $5\times10^{13}/cm^2$ to $1\times10^{16}/cm^2$ at a level from 20 keV to about 180 keV.

26. A semiconductor device comprising:

a doped semiconductor substrate, a buried conductive region in said substrate formed by dopant ions implanted into a predetermined location in said substrate, a thick silicon dioxide layer on the surface of said doped substrate over said implanted ions, a first polysilicon layer formed on said silicon dioxide layer, said first polysilicon layer being patterned, a first interpolysilicon layer on the surface of said first polysilicon layer on said device, said first interpolysilicon layer being patterned to expose the surface of said doped substrate, a second polysilicon layer formed on said interpolysilicon layer, said second polysilicon layer patterned to form a first capacitor plate, a second interpolysilicon layer formed on the surface of said second polysilicon layer, third polysilicon layer formed on said second interpolysilicon layer patterned to form a top capacitor plate, a second silicon dioxide layer on the exposed surface of said doped substrate, and a layer of BPSG upon said third layer of polysilicon.

* * * * *